(12) United States Patent
Chang et al.

(10) Patent No.: US 9,140,600 B2
(45) Date of Patent: Sep. 22, 2015

(54) OPTICAL PROXIMITY SENSOR AND MANUFACTURING METHOD THEREOF

(71) Applicants: TAIWAN IC PACKAGING CORPORATION, Kaohsiung (TW); uPI semiconductor corp., Hsinchu County (TW)

(72) Inventors: Yi-Hua Chang, Kaohsiung (TW); Sue-Ping Lin, Kaohsiung (TW); Chun-Chi Chen, Kaohsiung (TW); Tsung-Yu Hung, Kaohsiung (TW)

(73) Assignees: TAIWAN IC PACKAGING CORPORATION, Kaohsiung (TW); uPI semiconductor corp., Zhubei, Hsinchu County (TW)

( * ) Notice: Subject to any disclaimer, the term of this patent is extended or adjusted under 35 U.S.C. 154(b) by 315 days.

(21) Appl. No.: 13/769,634

(22) Filed: Feb. 18, 2013

(65) Prior Publication Data
US 2013/0292553 A1    Nov. 7, 2013

(30) Foreign Application Priority Data
May 4, 2012  (TW) .............. 101115960 A

(51) Int. Cl.
| | |
|---|---|
| *H01L 23/48* | (2006.01) |
| *G01J 1/04* | (2006.01) |
| *H01L 31/12* | (2006.01) |
| *H01L 31/173* | (2006.01) |

(Continued)

(52) U.S. Cl.
CPC . *G01J 1/04* (2013.01); *H01L 31/12* (2013.01); *H01L 31/173* (2013.01); *G01S 17/026* (2013.01); *H01L 21/561* (2013.01); *H01L 21/565* (2013.01); *H01L 21/568* (2013.01); *H01L 2224/2919* (2013.01); *H01L 2224/32245* (2013.01); *H01L 2224/48247* (2013.01); *H01L 2224/73265* (2013.01); *H01L 2224/92247* (2013.01); *H01L 2224/97* (2013.01)

(58) Field of Classification Search
CPC ............ H01L 2924/00; H01L 23/3114; H01L 23/49827; H01L 24/81
See application file for complete search history.

(56) References Cited

U.S. PATENT DOCUMENTS

| | | | |
|---|---|---|---|
| 8,097,852 B2 | 1/2012 | Yao | |
| 9,000,576 B2 * | 4/2015 | Lee et al. | 257/686 |
| 9,006,894 B2 * | 4/2015 | Kobayashi et al. | 257/746 |

(Continued)

FOREIGN PATENT DOCUMENTS

| | | |
|---|---|---|
| CN | 101936752 A | 1/2011 |
| CN | 102157510 A | 8/2011 |

(Continued)

*Primary Examiner* — Tony Ko
(74) *Attorney, Agent, or Firm* — Winston Hsu; Scott Margo

(57) ABSTRACT

The present invention is an optical proximity sensor and manufacturing method thereof. The optical proximity sensor has an optical sensing unit, an illuminating unit, multiple transparent gels and a package. The package encapsulates the optical sensing unit and the illuminating unit. The transparent gels are respectively formed on top surfaces of the optical sensing unit and the illuminating unit. The transparent gels respectively have a convex part and a recess formed in the convex part. The package has through holes communicating with the recesses of the transparent gels to form openings. In a step of injecting encapsulant gel, because the transparent gels are still plastic, the protrusions can closely attach to the transparent gels. The encapsulant gel is prevented from forming above the sensing part and the illuminating part.

12 Claims, 7 Drawing Sheets

(51) Int. Cl.
*H01L 21/56* (2006.01)
*G01S 17/02* (2006.01)

(56) References Cited

U.S. PATENT DOCUMENTS

| | | | |
|---|---|---|---|
| 9,018,774 B2 * | 4/2015 | Lee et al. | ............ 257/778 |
| 2010/0258710 A1 | 10/2010 | Wiese | |
| 2010/0327164 A1 | 12/2010 | Costello | |
| 2011/0057102 A1 | 3/2011 | Yao | |
| 2011/0057108 A1 | 3/2011 | Yao | |
| 2011/0057129 A1 | 3/2011 | Yao | |
| 2012/0305771 A1 | 12/2012 | Lai | |
| 2014/0193951 A1 * | 7/2014 | Kwon et al. | ............ 438/107 |
| 2015/0108204 A1 * | 4/2015 | Zheng et al. | ............ 228/180.22 |

FOREIGN PATENT DOCUMENTS

| | | |
|---|---|---|
| CN | 102395859 A | 3/2012 |
| TW | 200620687 | 6/2006 |
| TW | 200642094 | 12/2006 |
| TW | 200732980 | 9/2007 |
| TW | 201017921 | 5/2010 |

* cited by examiner

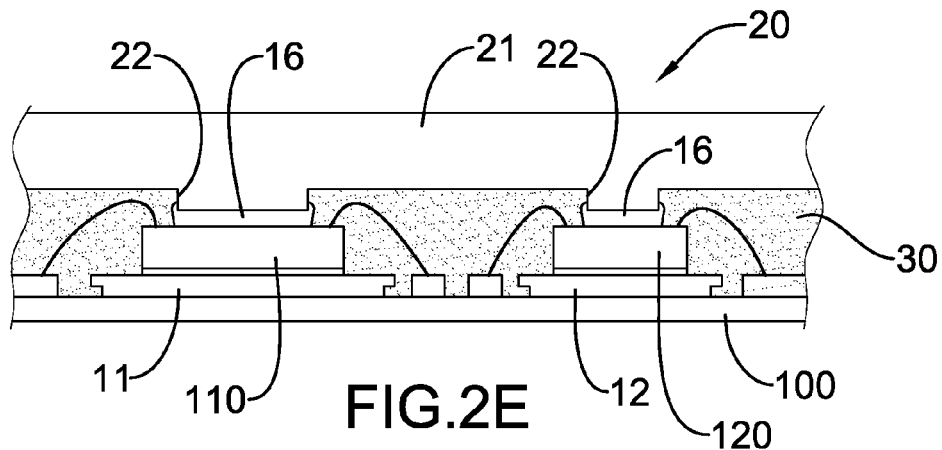
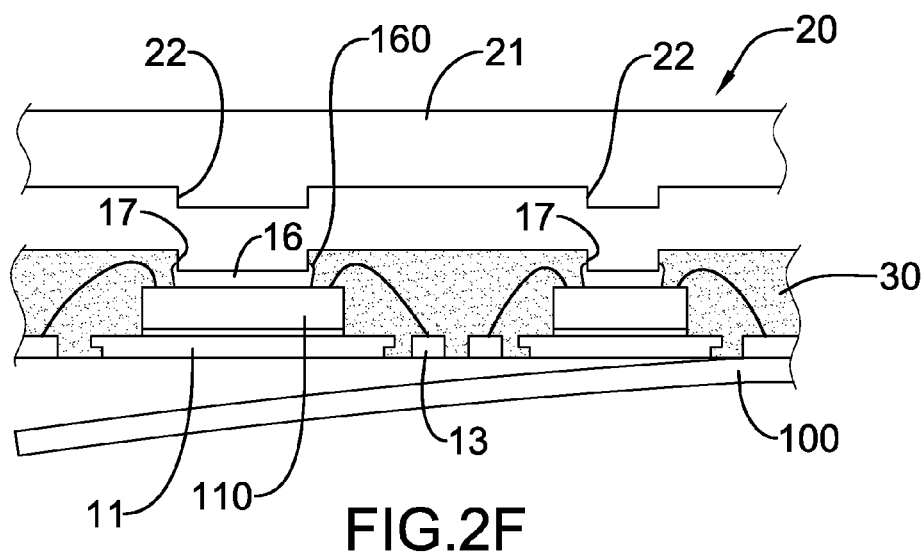
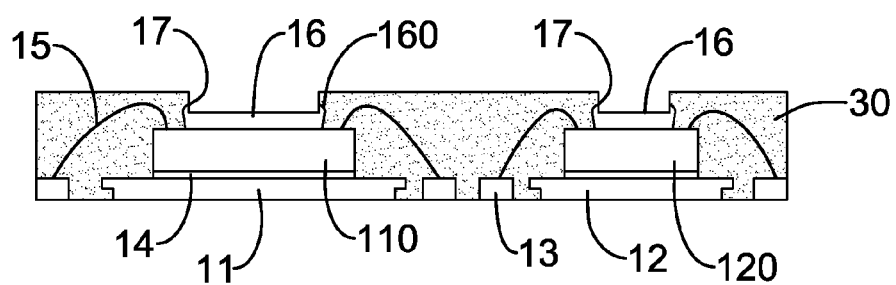

OPTICAL PROXIMITY SENSOR AND MANUFACTURING METHOD THEREOF

CROSS-REFERENCE TO RELATED APPLICATIONS

This application claims the benefit of Taiwan patent application No. 101115960, filed on May 4, 2012, the disclosure of which is incorporated herein in its entirety by reference.

BACKGROUND OF THE INVENTION

1. Field of the Invention

The present invention relates to a proximity sensor, and more particularly to an optical proximity sensor and a manufacturing method thereof.

2. Description of Related Art

With reference to FIG. 6, a conventional optical proximity sensor 60 comprises a substrate 61, a metal cover 62, an LED (Light Emitting Diode) device 63 and a sensing device 64.

The metal cover 62 is mounted on the substrate 61 and has a division 620, two spaces 621 and two openings 622. The two spaces 621 are divided by the division 620. The two openings 622 are formed on a top surface of the metal cover 62 and respectively communicate with the two spaces 621. The LED device 63 and the sensing device 64 are respectively mounted in the two spaces 621. When an object 65 approaches the optical proximity sensor 60, the object 65 reflects the light generated from the LED device 63. The sensing device 64 then detects the reflected light from the object 65.

The optical proximity device 60 is preferably small in volume and the metal cover 62 is manufactured by metal stamping. However, to stamp a metal piece into the small-volume metal cover 62 is difficult and expensive.

With reference to another proximity sensor of U.S. Pat. No. 8,097,852, the proximity sensor is mainly manufactured through twice packaging as described below.

With reference to FIG. 7A, a first step is to mount an illuminant device 71 and a sensing device 72 on a lead frame 70 and to respectively form transparent gels 73 on the illuminant device 71 and the sensing device 72. The above-mentioned forming of the transparent gels 73 is called a first packaging.

With reference to FIG. 7B, a second step is to press a mold 74 on the transparent gels 73 after the two transparent gels 73 solidify. The mold 74 has two protrusions 740 respectively attaching to a top surface of the transparent gels 73.

With reference to FIG. 7C, a third step is to inject an encapsulant gel 75 between the mold 74 and the lead frame 70, called a second packaging. The encapsulant gel 75 packages the illuminant device 71 and the sensing device 72 for protecting them from wetness and pollution.

With reference to FIG. 7D, a fourth step is to remove the mold 74 after the encapsulant gel 75 solidifies. Two holes 750 are then formed in the encapsulant gel 75 at positions previously occupied by the protrusions 740. Hence, the illuminant device 71 can emits lights outward through the transparent gels 73 and the hole 750. The sensing device 72 can detect lights entering the holes 750 and the transparent gels 73.

However, with reference to FIG. 7C, in the step of injecting the encapsulant gel 75, the transparent gels 73 have already solidified. The mold 74 cannot over-press on the solidified transparent gels 73 in order to avoid damaging the illuminant device 71 and the sensing device 72, resulting in poor marginal adaptation. When the encapsulant gel 75 is being injected among the mold 74 and the lead frame 70 by a high injecting pressure, the encapsulant gel 75 may permeate through the protrusions 740 and the transparent gels 73. With reference to FIG. 7D, when the mold 74 is removed, residue encapsulant gel 751 may be left on the transparent gels 73.

The sensing device 72 is used to detect environmental light variances. When the sensing device 72 receives a reflected light emitted from the illuminant device 71 and is reflected by an object, the sensing device 72 detects light variances. Hence, it is important to keep the transparent gels 73 pure without the residue encapsulant gel 751 such that the illuminant device 71 can normally emit lights and the sensing device 72 can normally receive lights. However, the residue encapsulant gel 751 spoils the transparent gel 73 and the lights emitted from the illuminate 71 and received by the sensing device 72 are blocked, causing low sensing accuracy.

SUMMARY OF THE INVENTION

An objective of the invention is to provide an optical proximity sensor and a manufacturing method thereof to avoid leaving encapsulant gel above a sensing chip and an illuminant chip.

The optical proximity sensor of the present invention comprises:

an optical sensing unit having a top surface and a sensing part;

an illuminating unit having a top surface and an illuminating part;

two transparent layers respectively formed on the top surfaces of the optical sensing unit and the illuminating unit, wherein each transparent layer has a convex part and a recess formed in the convex part; and a package encapsulating the optical sensing unit and the illuminating unit and having two through holes corresponding to the sensing part and the illuminating part, wherein the through holes respectively communicate with the recesses of the transparent layers.

The method of the invention comprises the steps of:

providing a lead frame comprising a first pad, a second pad and multiple pins;

respectively mounting a sensing chip and an illuminant chip on the first pad and the second pad, wherein the sensing chip has a sensing part and the illuminant chip has an illuminating part;

bonding multiple wires to connect the sensing chip and the illuminant chip to the pins;

respectively forming transparent gels on the sensing part and the illuminating part;

pressing a mold on the transparent gels, wherein the mold has protrusions corresponding to the sensing part and the illuminating part and bottoms of the protrusions are clad in the transparent gels;

injecting encapsulant gel among the mold and the lead frame;

removing the mold after the encapsulant gel solidifies to obtain an optical proximity sensor.

In conclusion, in the step of injecting encapsulant gel, because the transparent gels are still plastic, the bottoms of the protrusions are clad in the transparent gels to closely attach to the transparent gels. The encapsulant gel cannot permeate through the protrusions and the transparent gels. Therefore, the encapsulant gel is prevented from forming above the sensing part and the illuminating part. The transparent gels 73 keep pure without residue of the encapsulant gel. The accuracy of the optical proximity sensor of the invention is improved.

BRIEF DESCRIPTION OF THE DRAWINGS

FIGS. 2A-2G are manufacturing steps of the method of the first embodiment of the invention;

DETAILED DESCRIPTION OF THE PREFERRED EMBODIMENT

Figure 1:
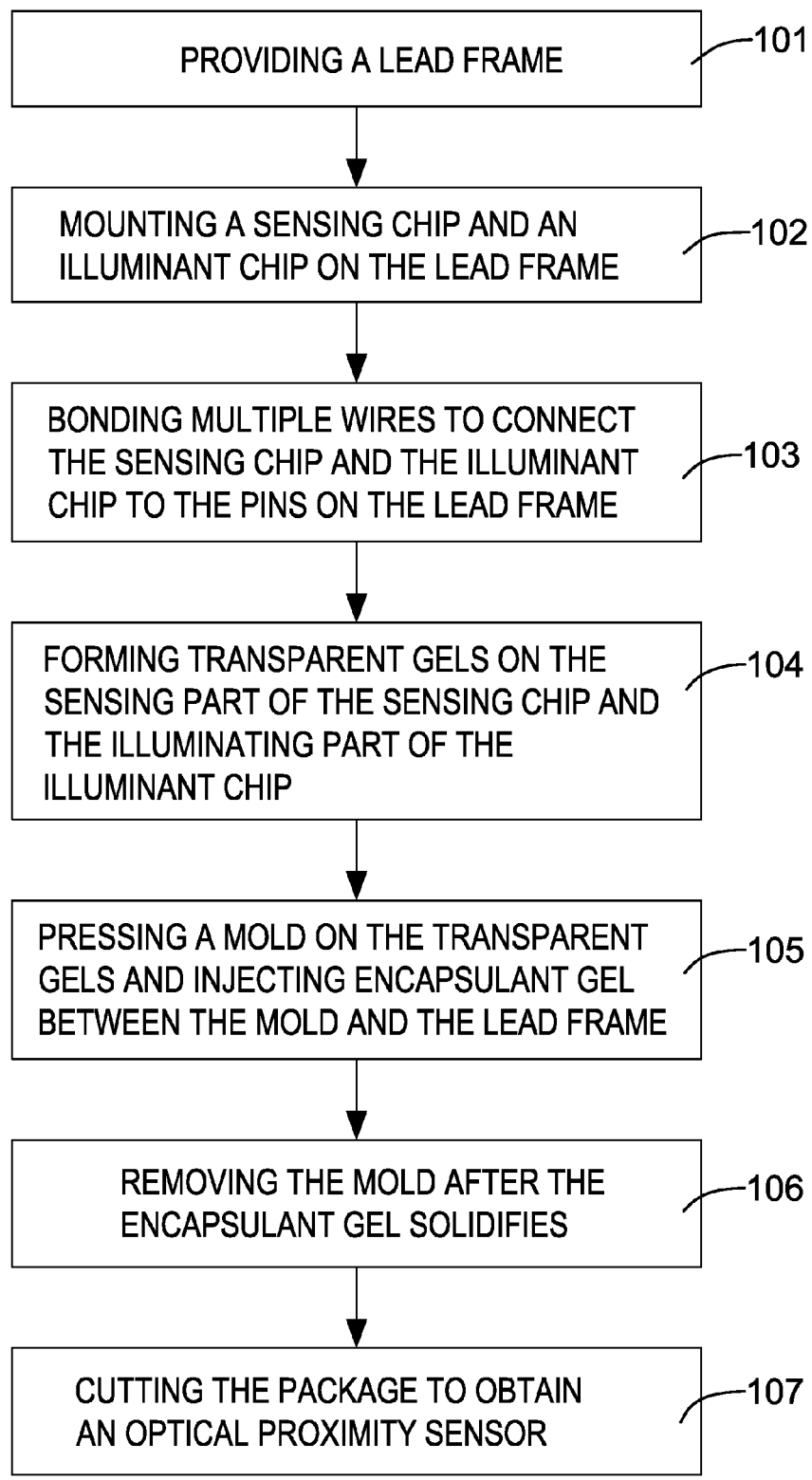
FIG. 1 is a flow chart of the method of a first embodiment of the invention.

With reference to FIG. 1, a flow chart of a first embodiment of the invention is disclosed. Further referring to the manufacturing steps of FIGS. 2A-2G, the following paragraphs describe the optical proximity sensor and the manufacturing method of the invention.

Figure 2A:
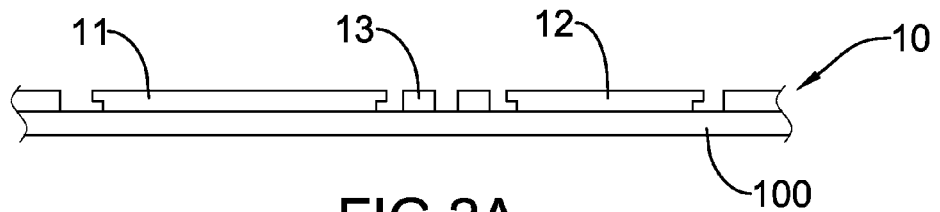

With reference to FIG. 2A, a first step is to provide a lead frame 10 (step 101). The lead frame 10 comprises a first pad 11, a second pad 12 and multiple pins 13. The pins 13 are mounted around the first pad 11 and the second pad 12. In a manufacturing process, the lead frame 10 is put on a tape 100. The tape 100 takes the lead frame 10 to go through the following steps.

Figure 2B:
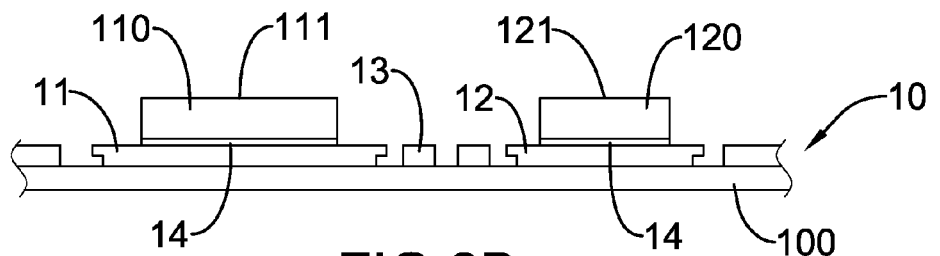

With reference to FIG. 2B, a second step is to mount a sensing chip 110 on the first pad 11 and mount an illuminant chip 120 on the second pad 12 (step 102). The sensing chip 110 has a top surface and a sensing part 111 formed on the top surface for sensing lights. The illuminant chip 120 has a top surface and an illuminating part 121 formed on the top surface for emitting lights. The chips 110, 120 respectively adhere to the pads 11, 12 through an adhesive layer 14. The adhesive layer 14 can be an epoxy layer. The sensing chip 110 can be an ALS (Ambient Light Sensor) chip. The illuminant chip 120 can be an infrared sensor chip.

Figure 2C:
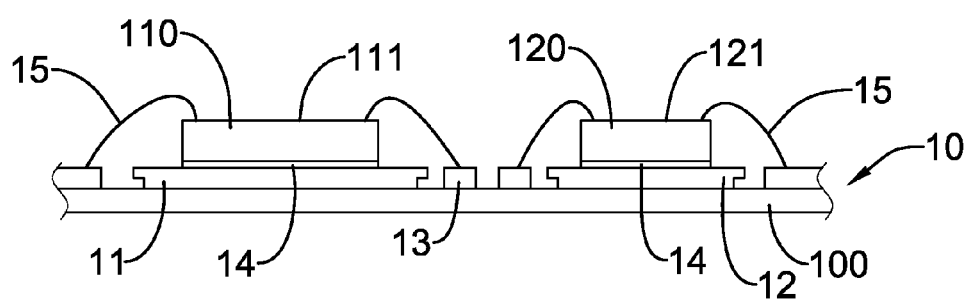

With reference to FIG. 2C, a third step is to bond wires 15 to connect the chips 110, 120 to the pins 13 (step 103). The chips 110, 120 respectively have electrodes on their top surfaces for connecting the wires 15.

Figure 2D:
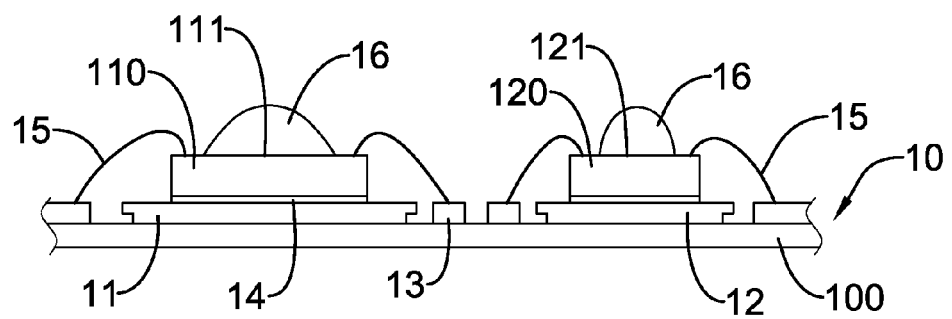

With reference to FIG. 2D, a fourth step is to respectively dispense a transparent gel 16 on the sensing part 111 of the sensing chip 110 and the illuminating part 121 of the illuminant chip 120 (step 104).

With reference to FIG. 2E, a fifth step is to press a mold 20 on the transparent gels 16 before the transparent gels 16 solidify and then to inject encapsulant gel 30 between the mold 20 and the lead frame 10 (step 105). The mold 20 has a plate 21 and multiple protrusions 22 formed on a bottom surface of the plate 21. The protrusions 22 respectively correspond to the transparent gels 16 in position. When the mold 20 presses on the transparent gels 16, the transparent gels 16 still do not solidify yet and is plastic. Bottoms of the protrusions 22 are then clad in the transparent gels 16 and the transparent gels 16 are respectively formed around the bottom of the protrusions 22. Afterward, the encapsulant gel 30 is injected between the mold 20 and the lead frame 10. A space between the mold 20 and the lead frame 10 is filled with the encapsulant gel 30. The encapsulant gel 30 packages the chips 110, 120 and the wires 15.

With reference to FIG. 2F, a sixth step is to remove the tape 100 and the mold 20 after the encapsulant gel 30 and the transparent gels 16 solidify (step 106). Two openings 17 are then formed in the encapsulant gel 30 at positions previously occupied by the protrusions 22. The solidified encapsulant gel 30 becomes a package. The solidified transparent gels 16 become transparent layers. The transparent layer has a convex part 160 formed around a bottom of the opening 17. The sensing chip 110, the first pad 11, the illuminant chip 120, the second pad 12 and the wires 15 are securely encapsulated in the package and do not shift or disconnect from each other.

With reference to FIG. 2G, a seventh step is to cut the package to obtain a single optical proximity sensor of the invention (step 107).

Figure 5A:
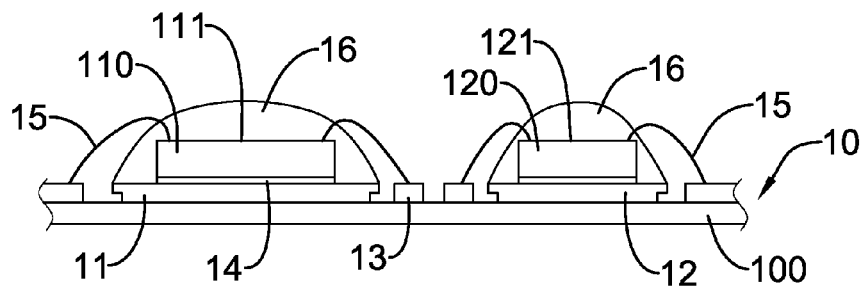
FIGS. 5A-5D are manufacturing steps of the method of a second embodiment of the invention.
Figure 5B:
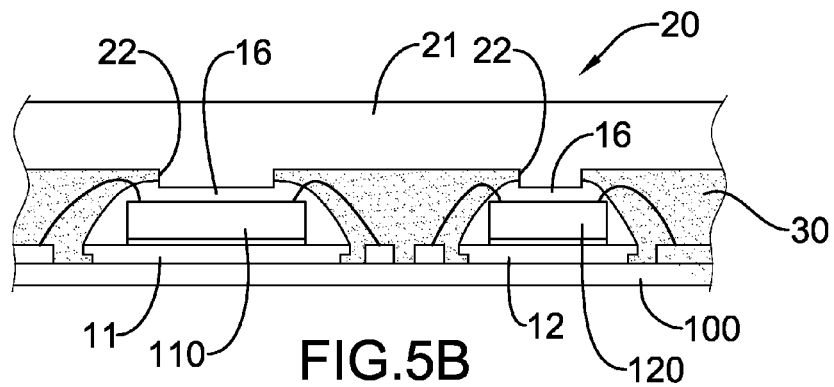
Figure 5C:
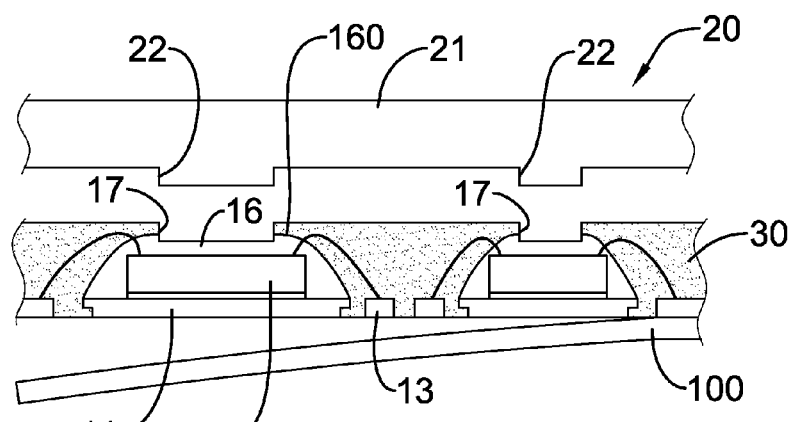
Figure 5D:
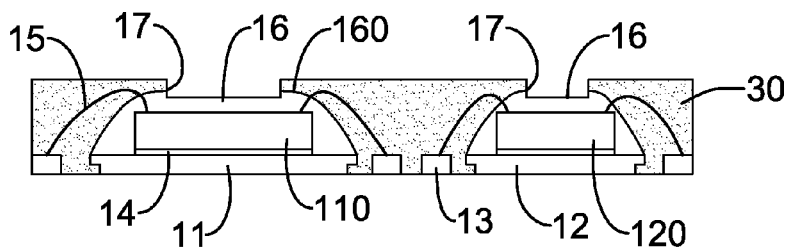
Figure 6:
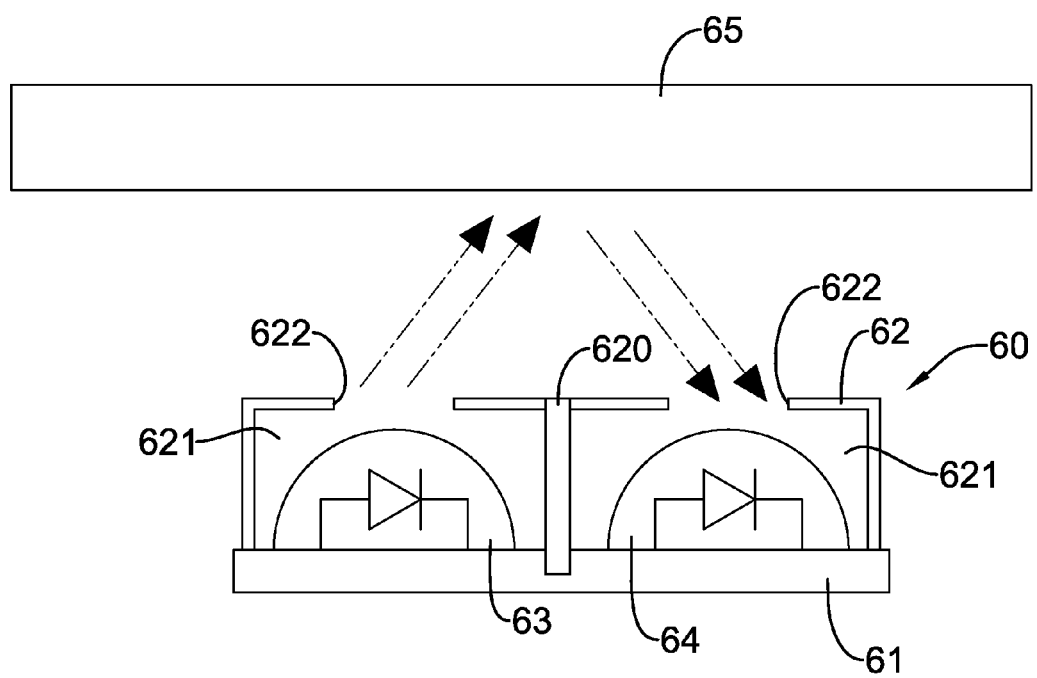
FIG. 6 is a plan view of a conventional optical proximity sensor.
Figure 7A:
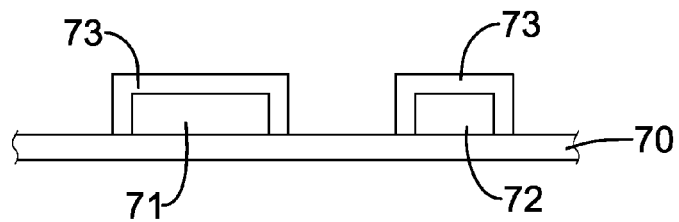
FIGS. 7A-7D are manufacturing steps of another conventional optical proximity sensor.
Figure 7B:
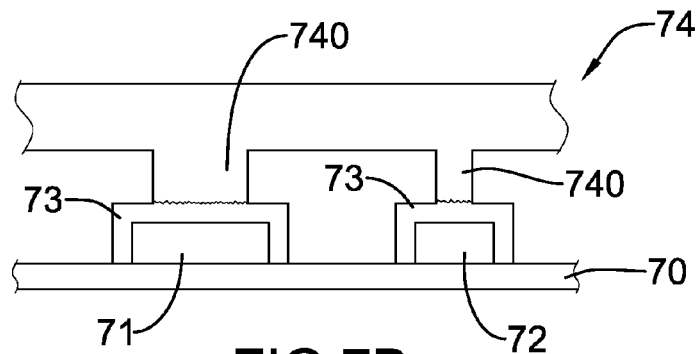
Figure 7C:
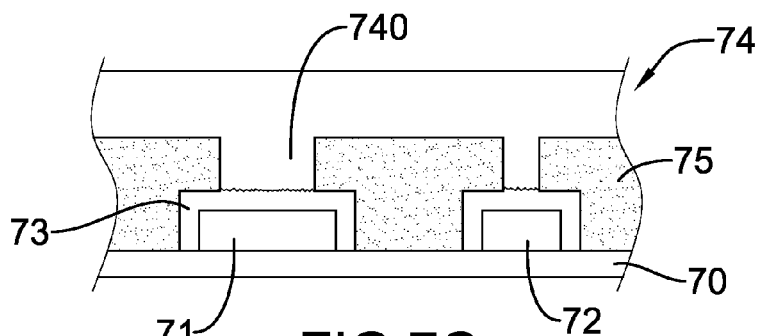
Figure 7D:
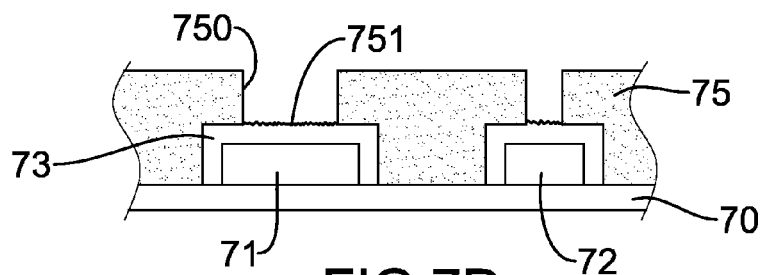

With reference to FIG. 5A, in the fourth step of a second embodiment of the method of the invention, the transparent gels 16 respectively cover the sensing chip 110 and the illuminant chip 120, such that the transparent gels 16 are formed on the sensing part 111 of the sensing chip 110 and the illuminating part 121 of the illuminant chip 120. With reference to FIGS. 5B-5D, the following steps of the second embodiment are the same as the steps 105-107 of the first embodiment.

Figure 3:
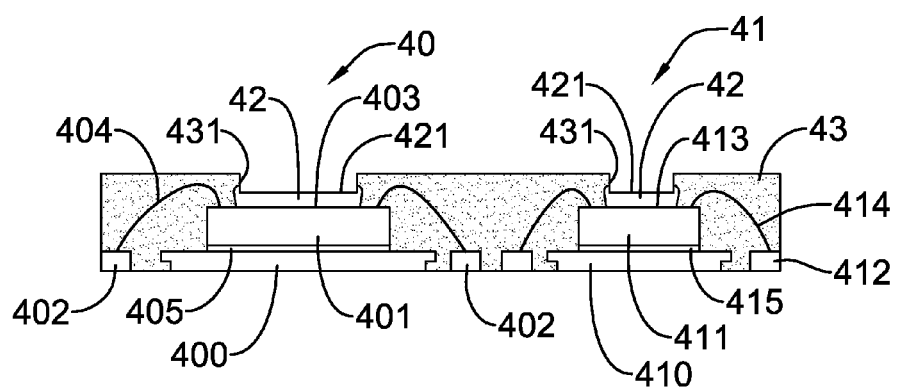
FIG. 3 is a plan view of the optical proximity sensor of the invention.
Figure 4:
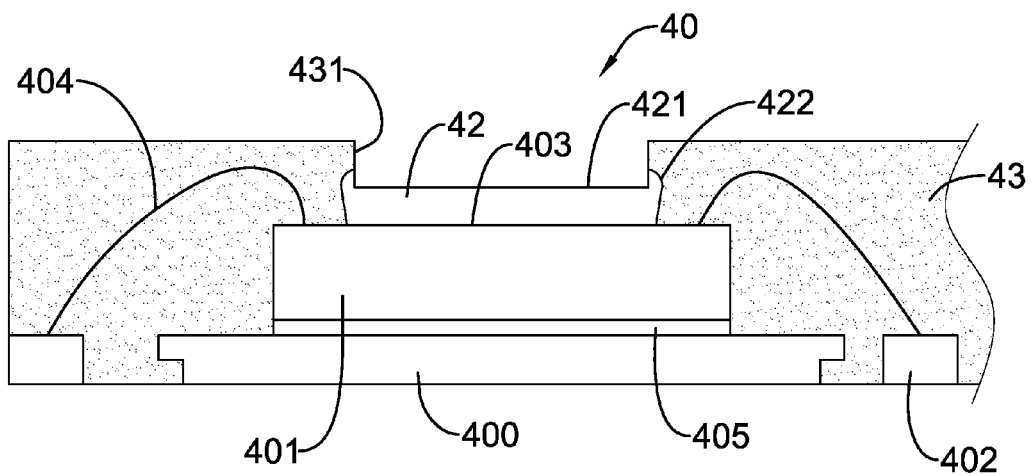
FIG. 4 is a partially enlarged view of FIG. 3.

According to the method as mentioned above, with reference to FIGS. 3 and 4, the optical proximity sensor of the invention comprises an optical sensing unit 40, an illuminating unit 41, multiple transparent layers 42 and a package 43.

The optical sensing unit 40 comprises a first pad 400, a sensing chip 401 and multiple pins 402. The sensing chip 401 is mounted on the first pad 400 and has a sensing part 403 and multiple electrodes. The electrodes are electrically connected to the pins 402 through wires 404. An adhesive layer 405 is formed between the sensing chip 401 and the first pad 400, such that the sensing chip 401 can securely adhere to the first pad 400.

The illuminating unit 41 comprises a second pad 410, an illuminant chip 411 and multiple pins 412. The illuminant chip 411 is mounted on the second pad 410 and has an illuminating part 413 and multiple electrodes. The electrodes are electrically connected to the pins 412 through wires 414. An adhesive layer 415 is formed between the illuminant chip 411 and the second pad 410, such that the illuminant chip 411 can securely adhere to the second pad 410.

The transparent layers 42 are respectively formed on the top surfaces of the optical sensing unit 40 and the illuminating unit 41. Each transparent layer 42 has a convex part 422 and a recess 421. The recess 421 is formed in the convex part 422. The convex parts 422 of the two transparent layers 42 respectively correspond to the sensing part 403 and the illuminating part 413. In the second embodiment, with reference to FIG. 5D, the solidified transparent gels 16 become transparent layers covering the sensing chip 110 and the illuminant chip 120.

The package 43 encapsulates the optical sensing unit 40 and the illuminating unit 41. The pins 402, 412 are exposed from a bottom surface of the package 43. A top surface of the package 43 has two through holes 431 respectively corresponding to the sensing part 403 and the illuminating part 413. The through holes 431 respectively communicate with the recesses 421 of the transparent layers 42. The above-mentioned openings 17 are composed of the through holes 431 and the recesses 421. A height of the convex part 422 is higher than that of a bottom surface of the recess 421.

Therefore, lights generated from the illuminant chip 411 can be emitted outward through the transparent layer 42. External lights can enter the sensing chip 401 through the transparent layer 42. The sensing device 72 can detect light variances.

In conclusion, in the step of injecting the encapsulant gel, the protrusions of the mold press the transparent gel before the transparent gel solidifies. The transparent gel is still plastic, such that the bottoms of the protrusions are embedded into the transparent gels. The protrusions and the transparent gels are closely attached. The encapsulant gel cannot permeate through the protrusions and the transparent layer. The encapsulant gel will not be formed above the sensing part 403 and the illuminating part 413.

The sensing chip and the illuminant chip are separated by the package to avoid an interference induced from the illuminant chip to the sensing chip. In addition, the transparent layers on the sensing chip and the illuminant chip are manufactured by a gel dispensing step. The gel dispensing step is more simplified and less expensive than the conventional metal stamping.

What is claimed is:

1. An optical proximity sensor comprising:
   an optical sensing unit having a top surface and a sensing part;
   an illuminating unit having a top surface and an illuminating part;
   two transparent layers respectively formed on the top surfaces of the optical sensing unit and the illuminating unit, wherein each transparent layer has a convex part and a recess formed in the convex part; and
   a package encapsulating the optical sensing unit and the illuminating unit and having two through holes corresponding to the sensing part and the illuminating part, wherein the through holes respectively communicate with the recesses of the transparent layers.

2. The sensor as claimed in claim 1, wherein
   the optical sensing unit comprises:
      a first pad;
      multiple pins exposed from the package; and
      a sensing chip having the sensing part, mounted on the first pad and electrically connected to the pins of the optical sensing unit; and
   the illuminating unit comprises:
      a second pad;
      multiple pins exposed from the package; and
      an illuminant chip having the illuminating part, mounted on the second pad and electrically connected to the pins of the illuminating unit.

3. The sensor as claimed in claim 2, wherein the sensing chip and the illuminant chip are connected to the pins through wires.

4. The sensor as claimed in claim 2, wherein the transparent layers respectively cover the sensing chip and the illuminant chip.

5. The sensor as claimed in claim 3, wherein adhesive layers are respectively formed between the sensing chip and the first pad and between the illuminant chip and the second pad.

6. The sensor as claimed in claim 3, wherein the transparent layers respectively cover the optical sensing unit and the illuminating unit.

7. The sensor as claimed in claim 5, wherein
   the sensing chip is an ALS (Ambient Light Sensor) chip; and
   the illuminant chip is an infrared sensor chip.

8. The sensor as claimed in claim 7, wherein the transparent layers respectively cover the optical sensing unit and the illuminating unit.

9. The sensor as claimed in claim 5, wherein the transparent layers respectively cover the optical sensing unit and the illuminating unit.

10. The sensor as claimed in claim 1, wherein
    the two through holes of the package respectively communicate with the recesses of the two transparent layers to form two individual openings;
    the sensing part and the illuminating part are respectively exposed in the two openings; and
    a height of the convex part is higher than that of a bottom surface of the recess.

11. The sensor as claimed in claim 10, wherein the transparent layers respectively cover the optical sensing unit and the illuminating unit.

12. The sensor as claimed in claim 1, wherein the transparent layers respectively cover the optical sensing unit and the illuminating unit.

* * * * *